United States Patent
Zhang

(10) Patent No.: US 8,904,659 B2
(45) Date of Patent: Dec. 9, 2014

(54) SIGNAL GENERATOR FOR ELECTROMAGNETIC MEASUREMENT AND ELECTROMAGNETIC MEASURING SYSTEM USING SAME

(71) Applicant: Gang Zhang, Shenzhen (CN)

(72) Inventor: Gang Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 176 days.

(21) Appl. No.: 13/660,322

(22) Filed: Oct. 25, 2012

(65) Prior Publication Data

US 2013/0160312 A1    Jun. 27, 2013

(30) Foreign Application Priority Data

Dec. 26, 2011   (CN) .......................... 2011 1 0440937

(51) Int. Cl.
*G01B 11/27* (2006.01)

(52) U.S. Cl.
USPC .............................................. 33/354; 33/286

(58) Field of Classification Search
USPC ...................... 33/227, 285, 286, 354, DIG. 21
See application file for complete search history.

(56) References Cited

U.S. PATENT DOCUMENTS

| | | | | |
|---|---|---|---|---|
| 5,864,956 | A | * | 2/1999 | Dong .............................. 33/227 |
| 2001/0020335 | A1 | * | 9/2001 | Busch ............................. 33/645 |
| 2006/0283029 | A1 | * | 12/2006 | Jan et al. ......................... 33/286 |
| 2007/0107240 | A1 | * | 5/2007 | Piekutowski ................... 33/286 |
| 2007/0109808 | A1 | * | 5/2007 | Hobden et al. ................. 33/227 |
| 2012/0130675 | A1 | * | 5/2012 | Schorr et al. ................... 33/286 |
| 2012/0203502 | A1 | * | 8/2012 | Hayes et al. ................... 33/228 |
| 2013/0074350 | A1 | * | 3/2013 | Le Mer et al. ................. 33/286 |
| 2013/0110314 | A1 | * | 5/2013 | Stieff ............................. 33/228 |
| 2013/0326892 | A1 | * | 12/2013 | Schorr ............................ 33/286 |

* cited by examiner

*Primary Examiner* — G. Bradley Bennett
(74) *Attorney, Agent, or Firm* — Novak Druce Connolly Bove + Quigg LLP

(57) ABSTRACT

A signal generator includes a main body supported by a holder, an antenna mounted on the main body for emitting electromagnetic waves, a bubble level mounted on the main body for indicating whether the main body is horizontally placed, and two laser generators mounted on the main body for generating laser beams. The holder is configured for adjusting the main body to be horizontally positioned and adjusting each of the laser beams to irradiate at a predetermined point each time.

12 Claims, 2 Drawing Sheets

SIGNAL GENERATOR FOR ELECTROMAGNETIC MEASUREMENT AND ELECTROMAGNETIC MEASURING SYSTEM USING SAME

BACKGROUND

1. Technical Field

The present disclosure relates to signal generators for electromagnetic measurementing and electromagnetic measuring systems employing the signal generators.

2. Description of Related Art

Electromagnetic measuring systems for testing electronic devices require periodical performance testing to ensure reliable electromagnetic measuring results. For performing a performance test, a signal generator is positioned in a radiation test system to generate electromagnetic waves which are received by a receiving antenna. The signal generator is required to be placed at the same position on a table each time. The position is marked out on the table. However, such a positioning method easily causes position deviation, which can affect the performance test result and further affect the reliability of the electromagnetic measuring results.

Therefore, there is room for improvement within the art.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

Figure 1:
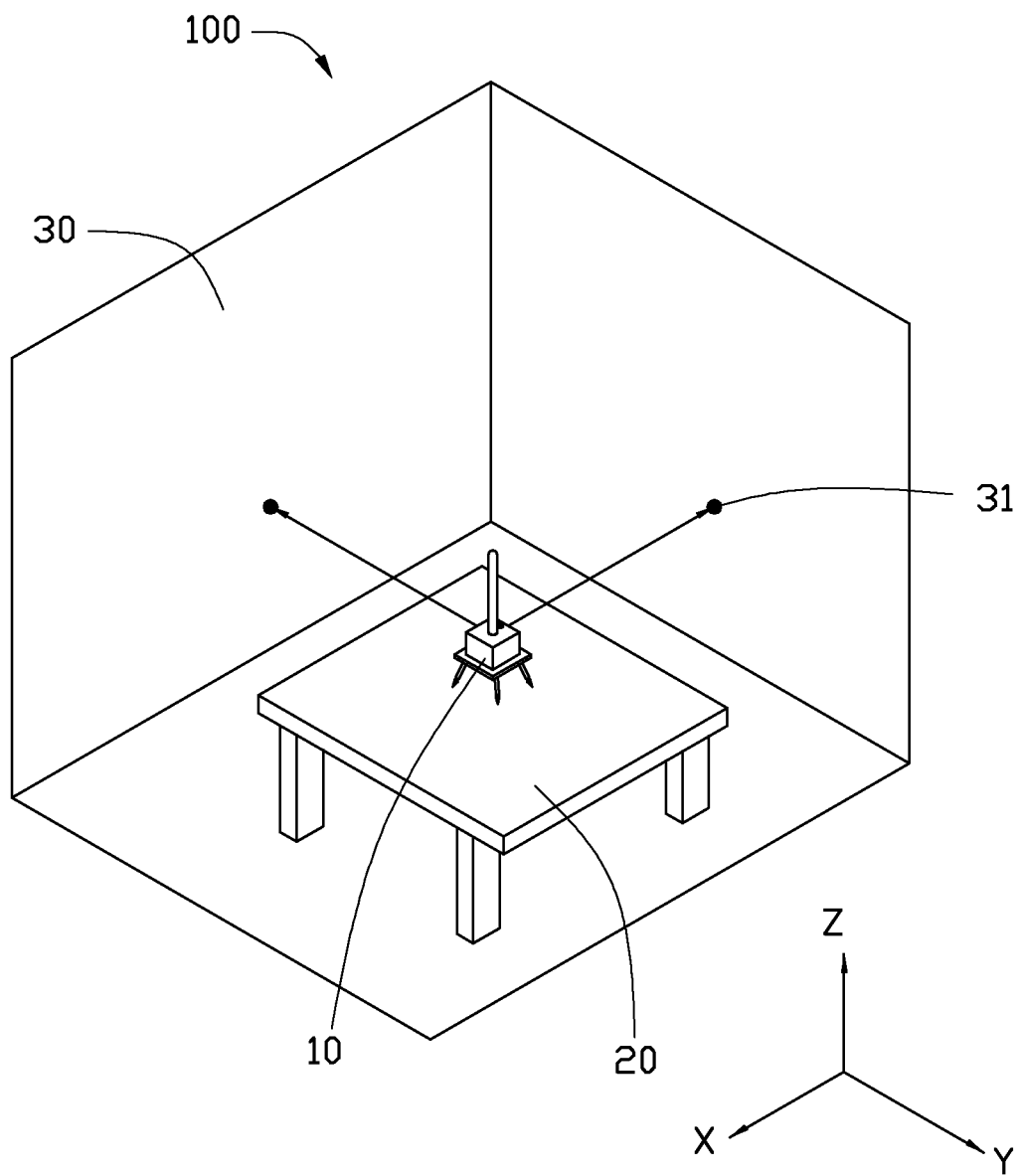
FIG. 1 is a plan view of an electromagnetic measuring system in accordance with an exemplary embodiment.

FIG. 1 shows an exemplary embodiment of an electromagnetic measuring system 100. The electronic measuring system 100 is used for measuring electromagnetic radiation of electronic devices, such as mobile phones and computers. The electromagnetic measuring system 100 comprises a signal generator 10, a table 20 supporting the signal generator 10, and at least two reflection walls 30 surrounding the electromagnetic measuring system 100.

Figure 2:
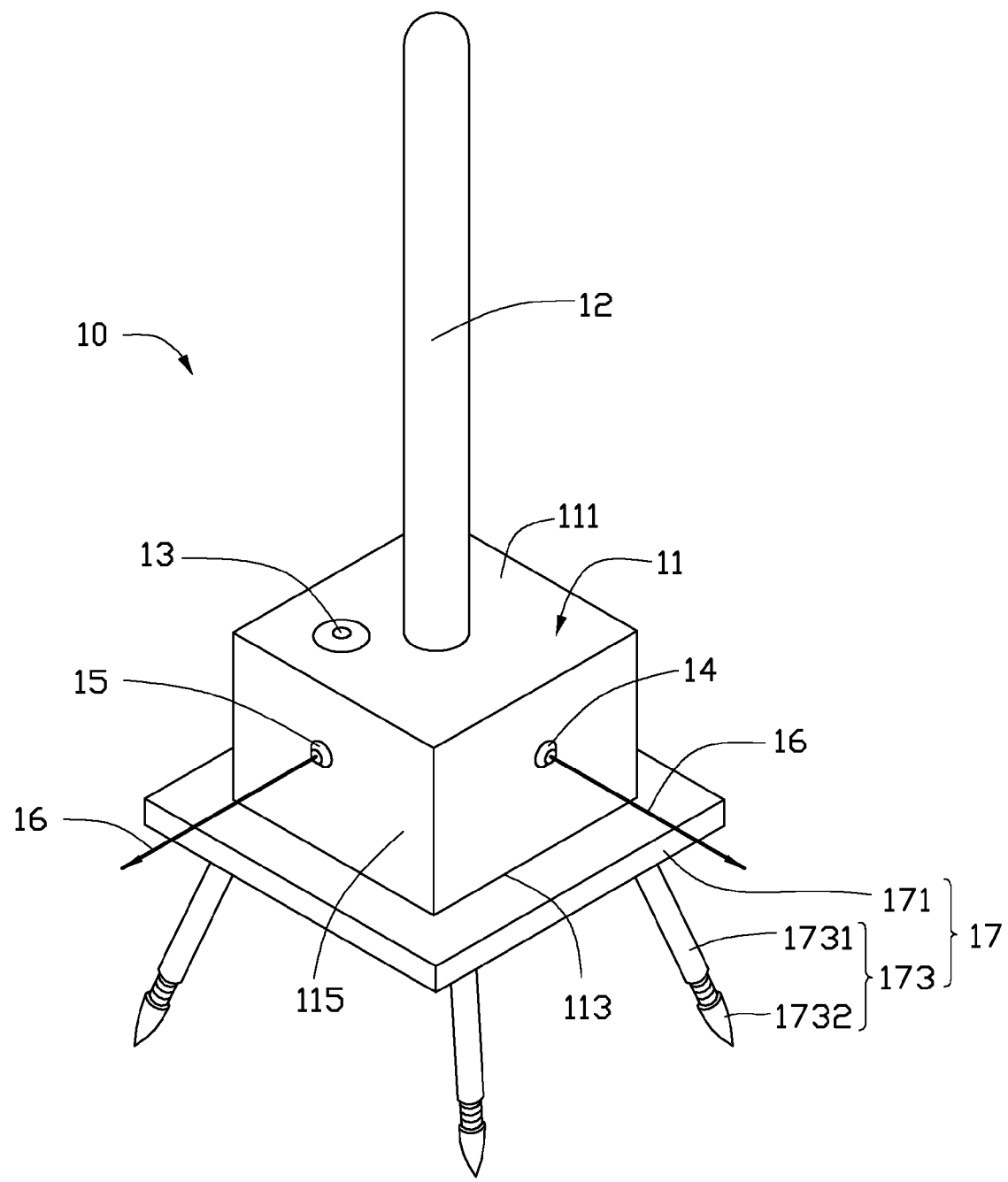
FIG. 2 is a schematic view of a signal generator in accordance with an exemplary embodiment.

FIG. 2 shows the signal generator 10 comprises a main body 11, an antenna 12 for emitting electromagnetic waves, a bubble level 13, laser generators 15, and a holder 17. The antenna 12, the leveler 13, the laser generators 15, and the holder 17 all are mounted on the main body 11. The main body 11 is substantially rectangular and has a top surface 111, a bottom surface 113 opposite to the top surface 111, and two adjacent side surfaces 115 located between the top surface 111 and the bottom surface 113. The antenna 12 is secured to the top surface 111. The signal generator 10 is used for periodically testing performances of the electromagnetic measuring system 100.

The bubble level 13 is secured to the top surface 111. The bubble level 13 indicates whether the signal generator 10 is horizontally placed on the table 20, thereby helping position the main body 11 in an X-Y plane as shown in FIG. 1.

In the exemplary embodiment, the signal generator 10 has a first laser generator 14 and a second laser generator 15. The first laser generator 14 and the second laser generator 15 each is mounted on one of the side surfaces 115 and corresponds to (or faces) one of the reflection walls 30. The first laser generators 14 is configured for positioning the signal generator 10 in an X-Z plane of a three-dimensional coordinate system as shown in FIG. 1. The second laser generator 15 is configured for positioning the signal generator 10 in a Y-Z plane as shown in FIG. 1. The first and second laser generators 14, 15 each generates a laser beam 16. Each of the reflection walls 30 has an irradiating point 31 marked. When the laser beams 16 generated by the first and second laser generators 14, 15 irradiate at the irradiating points 31 on the corresponded reflection walls 30, the signal generator 10 is positioned at a correct position in the X-Z plane and the Y-Z plane. Preferably, the laser beams 16 are visible to be easily observed by testers with the naked-eye.

The holder 17 supports the main body 11 on the table 20 and is used to adjust the position of the main body 11. The holder 17 comprises a support board 171, secured to the bottom surface 113 of the main body 11, and a plurality of support feet 173, attached to the support board 171 and spaced from each other. Each support foot 173 comprises a first pole 1731 and a second pole 1732 thredly connected to the first pole 1731. One end of each first pole 1731 attached to the support board 171. Another end of each first pole 1731 is thredly connected to a second pole 1732. Screwing the second poles 1732 to tighten or loosen the second poles 1732, thereby changing the length of each support foot 173 and adjusting the main body 11 to be horizontally positioned. Moreover, screwing the second poles 1732 to tighten or loose the second poles 1732 can further adjust the laser beams 16 to irradiate at the irradiating points 31 on the reflection walls 30, thereby ensuring the main body 11 to be accurately positioned at the same position each time. In the exemplary embodiment, the holder 17 comprises four support feet 173. In other embodiments, the number of the support feet 173 is not limited to be four.

In other embodiments, the support board 171 can be omitted. In this case, the support feet 173 can be directly attached to the bottom surface 113 of the main body 11.

When the signal generator 10 is used to test the performances of the electromagnetic measuring system 100 for the first time, the signal generator 10 is placed on the table 20. The position of the signal generator 10 is roughly adjusted, enabling the laser beams 16 generated by the signal generator 10 each to irradiate on one of the reflection walls 30 at a position near the irradiating point 31 thereof. Then, the second poles 1732 are screwed to tighten or loose the second poles 1732, thereby enabling the main body 11 to be horizontally positioned and enabling the laser beams 16 to accurately irradiate at predetermined points (such as the irradiating points 31) on the reflection walls 30. When use the signal generator 10 to test the performances of the electromagnetic measuring system 100 again, adjusting the laser beams 16 to accurately irradiate at the same points on the reflection walls 30 can ensuring a good stability and repeatability of the tests.

It is to be understood, however, that even through numerous characteristics and advantages of the present disclosure have been set forth in the foregoing description, together with details of assembly and function, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A signal generator, comprising:
a main body supported by a holder;
an antenna mounted on the main body for emitting electromagnetic waves;
a bubble level mounted on the main body for indicating whether the main body is horizontally placed; and
two laser generators mounted on the main body for generating laser beams;
wherein the holder is configured for adjusting the main body to be horizontally positioned and adjusting each of the laser beams to irradiate at a predetermined point each time.

2. The signal generator as claimed in claim 1, wherein the main body comprises a top surface, a bottom surface opposite to the top surface, and two adjacent side surfaces located between the top surface and the bottom surface; and each laser generator is secured to one of the side surfaces.

3. The signal generator as claimed in claim 2, wherein the bubble level is secured to the top surface.

4. The signal generator as claimed in claim 2, wherein the holder is attached to the bottom surface.

5. The signal generator as claimed in claim 1, wherein the holder comprises a plurality of support feet; each support foot comprises a first pole and a second pole; one end of each first pole attached to the main body; another end of each first pole is threadly connected to one of the second poles; the main body is adjusted to be horizontally positioned by screwing the second poles to tighten or loose the second poles.

6. The signal generator as claimed in claim 1, wherein the holder comprises a support board secured to the main body and a plurality of support feet attached to the support board; each support foot comprises a first pole and a second pole; one end of each first pole attached to the support board; another end of each first pole is threadly connected to one of the second poles; and the main body is adjusted to be horizontally positioned by screwing the second poles to tighten or loose the second poles.

7. An electromagnetic measuring system, comprising:
a signal generator supported by a table; and
two reflection walls surrounding the electromagnetic measuring system, each reflection wall having an irradiating point marked;
wherein the signal generator comprises:
a main body supported by a holder on the table;
an antenna mounted on the main body for emitting electromagnetic waves;
a bubble level mounted on the main body for indicating whether the main body is horizontally placed; and
two laser generators mounted on the main body for generating laser beams, each laser generator corresponding to one of the reflection walls;
wherein the holder is configured for adjusting the main body to be horizontally positioned and adjusting each of the laser beams to irradiate at one of the predetermined point each time.

8. The electromagnetic measuring system as claimed in claim 7, wherein the main body comprises a top surface, a bottom surface opposite to the top surface, and two adjacent side surfaces located between the top surface and the bottom surface; each laser generator is secured to one of the two adjacent side surfaces.

9. The electromagnetic measuring system as claimed in claim 8, wherein the bubble level is secured to the top surface.

10. The electromagnetic measuring system as claimed in claim 8, wherein the holder is attached to the bottom surface.

11. The electromagnetic measuring system as claimed in claim 7, wherein the holder comprises a plurality of support feet; each support foot comprises a first pole and a second pole; one end of each first pole attached to the main body; another end of each first pole is threadly connected to one of the second poles; and the main body is adjusted to be horizontally positioned by screwing the second poles to tighten or loose the second poles.

12. The electromagnetic measuring system as claimed in claim 7, wherein the holder comprises a support board secured to the main body and a plurality of support feet attached to the support board; each support foot comprises a first pole and a second pole; one end of each first pole attached to the support board; another end of each first pole is threadly connected to one of the second poles; the main body is adjusted to be horizontally positioned by screwing the second poles to tighten or loose the second poles.

* * * * *